United States Patent [19]

Morin et al.

[11] 4,426,407

[45] Jan. 17, 1984

[54] PROCESS FOR PRODUCING THIN-FILM TRANSISTORS ON AN INSULATING SUBSTRATE

[76] Inventors: Francois Morin, Le Carpont Lanmerin, 22300 Lannion; Jean-Luc Favennec, 16, Cité du Vallon, Saint Quay Perros 22700 Perros Guirec; Madeleine Bonnel, 58, Résidence du Roux, 22300 Lannion, all of France

[21] Appl. No.: 451,413

[22] Filed: Dec. 20, 1982

[30] Foreign Application Priority Data

Dec. 23, 1981 [FR] France .................. 81 24118

[51] Int. Cl.$^3$ .................. B05D 5/12; B05D 3/06; C23F 1/02; B44C 1/22
[52] U.S. Cl. .................. 427/86; 156/653; 156/656; 156/657; 156/659.1; 427/88; 427/93; 430/313; 430/317; 430/318
[58] Field of Search .................. 156/650-653, 156/655, 656, 657, 659.1, 661.1, 643, 662; 427/38, 39, 85, 86, 88, 90, 93; 430/312, 313, 315, 316, 317, 318

[56] References Cited

U.S. PATENT DOCUMENTS

| | | | |
|---|---|---|---|
| 4,169,746 | 10/1979 | Ipri et al. | 148/175 |
| 4,263,058 | 4/1981 | Brown et al. | 148/6 |
| 4,276,688 | 7/1981 | Hsu | 29/571 |
| 4,332,837 | 6/1982 | Peyre-Lavigne | 427/57 |
| 4,356,622 | 11/1982 | Widmann | 29/571 |
| 4,378,628 | 4/1983 | Levinstein et al. | 427/88 X |

FOREIGN PATENT DOCUMENTS

2909320 9/1979 Fed. Rep. of Germany .
2077039 6/1980 United Kingdom .

OTHER PUBLICATIONS

Hydrogenation of Transistors Fabricated in Polycrystalline-Silicon Films, IEE Electron Device Letters, vol. EdL-1, No. 8, Aug., 1980, pp. 159-161.
Electronics Letters, Jul. 5, 1979, vol. 15, No. 14, pp. 435-437.

*Primary Examiner*—William A. Powell
*Attorney, Agent, or Firm*—Pearne, Gordon, Sessions, McCoy, Granger & Tilberry

[57] ABSTRACT

Process for the production of thin-film transistors on an insulating substrate, wherein it comprises the following stages:

1. deposition on an insulating substrate of a coating of a metal able to form a silicide in contact with a silicon,
2. photoengraving of the first metal coating to define the sources, drains and channels for the future transistors and various connections between the transistors,
3. deposition of a silicon coating by reactive gaseous phase plasma, which leads to the appearance of a silicide coating in contact with the metal of the photoengraved coating,
4. deposition of a silica coating by reactive gaseous phase plasma,
5. deposition of a conductive coating by reactive gaseous phase plasma,
6. photoengraving of the conductive coating-silica coating-silicon coating system, without etching the silicide covering the photoengraved metal coating.

Application to the production of large-area electronic components used e.g. in the production of flat display screens and the like.

11 Claims, 1 Drawing Figure

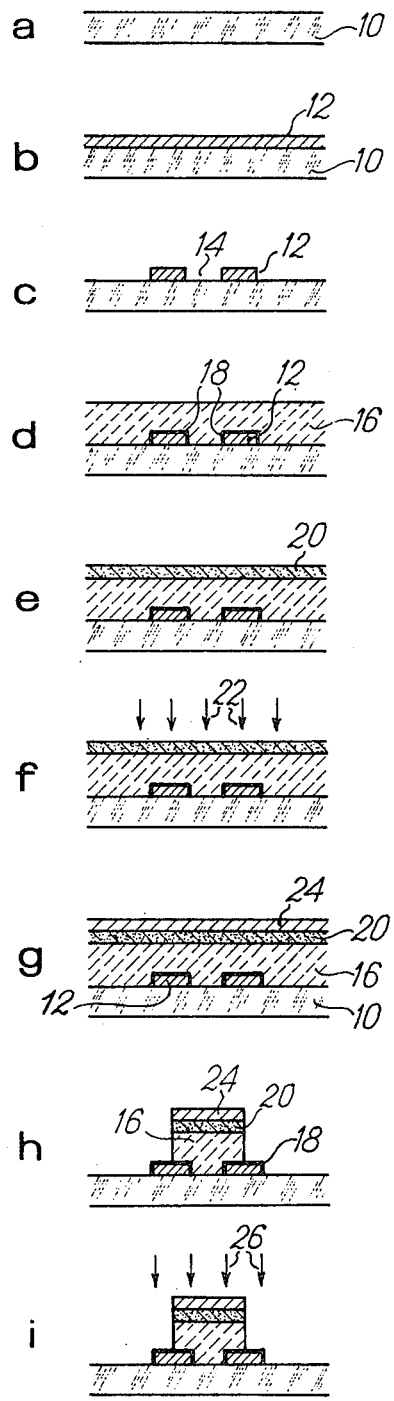

PROCESS FOR PRODUCING THIN-FILM TRANSISTORS ON AN INSULATING SUBSTRATE

BACKGROUND OF THE INVENTION

The present invention relates to a process for the production of thin-film silicon transistors on an insulating substrate. It is more particularly used in the production of electronic components with a large surface area. Such components are used in the construction of flat display screens, electronic retinas, active sensors, electronic memories, etc.

A thin-film transistor (TFT) is an insulated grid field effect transistor. It is similar to a MOS transistor (metal-oxide semiconductor) with the difference that it is produced on an amorphous substrate and not on a monocrystalline silicon wafer. As they are not limited by the size of the crystalline substrate, TFT circuits can have very large dimensions.

The TFT on an insulating substrate has been investigated in three different ways:

Way 1: Prior to the advent of MOS technology on silicon, a large amount of research dealt with the production of TFT's on the basis of binary compounds (II–VI), such as CdS and CdSe. They essentially consisted of thin film polycrystalline semiconductors, the TFT being obtained by vacuum masking. Recent variants have been proposed, including photoengraving stages. One of these variants consists of uniformly depositing four layers, respectively of insulating, semiconductor, insulating and metallic materials, followed by the photoengraving of the three latter layers.

Way 2: A second way, which is less than 5 years old, uses silicon monocrystals on an amorphous substrate, with the aim of increasing the compactness of the integrated circuits and if possible to obtain a three-dimensional form. Silicon recrystallization is brought about by laser action and various means are used for obtaining a monocrystal or polycrystal with large grains. Once the silicon has been recrystallized, the process used for producing the transistor is identical to MOS technology, namely implantation, diffusion, oxidation, etc. In all cases it is a high temperature process, which is incompatible with the use of an inexpensive large-size substrate, such as glass. Thus, the field of application is limited to microelectronics.

Way 3: Recently, research has been directed at producing TFT's made from hydrogenated amorphous silicon for producing flat liquid crystal screens. These TFT's are produced by stages involving photoengraving processes from a low temperature hydrogenated amorphous silicon deposit (250° to 300° C.). However, at this temperature, the silicon has a very high hydrogen level (10 to 20%), which is highly prejudicial to the possible recrystallization of the silicon. This recrystallization is necessary if it is wished to produce all the control circuits of the screen and in particular peripheral shift registers (video signal addressing circuit).

In addition, these three ways have the following disadvantages:

Way 1: The composite semiconductors (II–VI) are not very reliable, vacuum masking being limited in resolution and flexibility, whilst photoengraving processes are complex. Reference can be made in this connection to the article by LUO, published in "IEEE Trans. on Electr. Devices", vol. ED 27, no. 1, January 1980.

Way 2: High temperature processes are limited to noble and expensive substrates, such as silica substrates (cf. the article by D. K. Biegelsen et al., published in "Appl. Phys. Lett", 38, no. 3, Feb. 1st 1981).

Way 3: The structure proposed is relatively complex and there is a lack of compatibility with the recrystallization of the silicon. Reference can be made in this connection to the article by Matsamura, published in the "Proceedings of the 12th Conference on Solid State Devices", Tokyo 1980, published in "Japanese Journal of Appl. Phys.", vol. 20, 1981, supp. 20E, pp. 311–314.

BRIEF SUMMARY OF THE INVENTION

The problem of the invention is to obviate these disadvantages by proposing a simplified process for the production of amorphous or polycrystalline silicon TFT's on a large substrate, e.g. of glass.

As a result of the invention, polycrystalline silicon and amorphous silicon TFT's have been obtained on a glass substrate, having comparable or even superior electrical characteristics to those obtained by ways 1 and 3. Moreover, a complex integrated circuit (having up to $10^5$ TFT's) can be obtained on a surface of 1 $dm^2$. Amorphous (aSi) and polycrystalline (polySi) silicon TFT's obtained by the process according to the invention have a conduction current/blocking current ratio of approximately $10^4$ with amorphous silicon and $10^3$ with polycrystalline silicon. In the latter case, the mobility of the carriers, measured by field effect, is approximately 20 $cm^2/Vs$ (source-drain current of 100 $\mu A$ for a $50 \times 100$ $\mu m^2$ channel). These values can be further improved, particularly optimizing the recrystallization by laser (or by electronic flash tubes). However, even without this optimization, the aSi TFT's obtained are suitable for the control of liquid crystal screens.

A complex circuit can be obtained having $320 \times 320$ TFT's on a surface of $8 \times 8$ cm. The matrix obtained forms one of the faces of a liquid crystal cell, the other face being formed by a glass sheet coated with a transparent conductive coating. It is possible to integrate the addressing circuits of the video signal of the periphery of the transistor matrix. These circuits are constituted by polycrystalline transistors. One of the interests of the production process according to the invention is that it makes it possible to simultaneously produce aSi and polySi TFT's on a glass substrate.

All the results according to the invention are obtained by a process, wherein it comprises the following stages:

1. deposition on an insulating substrate of a coating of a metal able to form a silicide in contact with a silicon.

2. photoengraving of the first metal coating to define the sources, drains and channels for the future transistors and various connections between the transistors, 3. deposition of a silicon coating by reactive gaseous phase plasma, which leads to the appearance of a silicide coating in contact with the metal of the photoengraved coating, 4. deposition of a silica coating by reactive gaseous phase plasma, 5. deposition of a conductive coating by reactive gaseous phase plasma, 6. photoengraving of the conductive coating-silica coating—silicon coating system, without etching the silicide covering the photoengraved metal coating.

DESCRIPTION OF THE DRAWINGS AND PREFERRED EMBODIMENTS

The invention is described in greater detail hereinafter relative to a non-limitative embodiment and with reference to the attached drawing showing different stages (a) to (i) of the procedure for producing a transistor according to the process of the invention.

The various operations constituting the process of the invention are as follows:

OPERATION 1

Preparation of a glass substrate (e.g. Corning 7059), conventional pysico-chemical cleaning, in the FIGURE (a) the substrate carries reference 10.

OPERATION 2

Deposition of a metal coating 12 over the entire substrate and having a thickness between 500 and 2000 Å and preferably approximately 1000 Å, this metal being used for the source and drain contacts, but it is also possible to use a nickel-chrome alloy, which forms a silicide at low temperature (400° C.) (b).

OPERATION 3

The Nicr coating is photoengraved to define the channel 14 of the future transistors and the various connections between them, this operation requiring a first mask and leads to the product shown at (c).

OPERATION 4

Deposition of a silicon coating by reactive gaseous phase plasma (CVD-plasma) at a temperature between 400° and 600° C. and preferably close to 500° C., a silicide coating 18 forming on the surface of the photoengraved coating 12.

OPERATION 5

Deposition of a silica coating 20 by the same method, at the same temperature or even a lower temperature (e).

OPERATION 6

When wishing to obtain a polycrystalline silicon, the sample then undergoes radiation 22 by a laser or an electronic flash tube, either in situ (preferably) or outside the deposition reactor (f).

OPERATION 7

Deposition of a metallic grid coating 24, e.g. of highly doped silicon or aluminium (by CVD-plasma) on the entire surface of the sample (g).

OPERATION 8

Using a second mask photoengraving takes place of the grid 24—insulant 20—semiconductor 16 sandwich, without etching the silicide coating 18 formed on the nickel-chrome (h), said operation optionally being performed by the wet or dry methods and in the latter solution it is easy to obtain the selectivity. The silicon grid makes it possible to carry out a controlled underetching of the silicon, which reduces the grid-drain and grid-source leakage current.

OPERATION 9

The component undergoes post-hydrogenation (symbolized by arrows 26 in the FIGURE (i) to reduce the number of defects and improve the interfaces. This operation takes place in a hydrogen plasma at 400° C., the hydrogen pressure being e.g 0.1 torr and the Rf power 20 W. Hydrogenation is complete after 15 minutes. Although the hydrogen quantities introduced into the silicon during this operation are low (approx. 1%), the electronic properties are decidedly improved. Photoconductivity appears, mobility is increased by more than a factor of 10. the number of hanging bonds of the silicon passes from $10^{19}$ cm$^{-3}$ to a few $10^{16}$ cm$^{-3}$.

OPERATION 10

The compound is then passivated by a CVD-plasma-deposited $SiO_2$ coating and windows are optionally made for making the various connections necessary in producing the not shown circuit.

It can be seen that the process according to the invention is compatible with the processes for recrystallizing silicon by optical radiation. If this recrystallization is localized, it is possible to obtain amorphous silicon transistors, as well as polycrystalline silicon transistors from the same glass substrate. This is of particular interest in the production of integrated control, electronic, flat display screens.

What is claimed is:

1. A process for the production of thin-film transistors on an insulating substrate, wherein it comprises the following stages:
   deposition on an insulating substrate of a coating of a metal able to form a silicide in contact with a silicon;
   photoengraving of the metal coating to define the sources, drains and channels for the transistors and various connections between the transistors;
   deposition of a silicon coating by reactive gaseous phase plasma, a silicide coating forming on the surface of the metal of the photoengraved coating;
   deposition of a silica coating by reactive gaseous phase plasma;
   deposition of a conductive coating by reactive gaseous phase plasma, and
   photoengraving of the conductive coating - silica coating - silicon coating system, without etching the silicide coating covering the photoengraved metal coating.

2. A process according to claim 1, wherein it also comprises the operations of post-hydrogenating a system in a hydrogen plasma and passivating the system with a reactive gaseous phase plasma-deposited silica coating.

3. A process according to claim 1, wherein the conductive coating is of metal.

4. A process according to claim 3, wherein the conductive coating is of aluminium.

5. A process according to claim 1, wherein the conductive coating is of highly doped silicon and is obtained by reactive gaseous phase plasma.

6. A process according to claim 1, wherein the metal of the coating deposited on the substrate is a nickel-chrome alloy.

7. A process according to claim 6, wherein the thickness of the nickel-chrome coating is between 500 and 1500 Å and is preferably close to 1000 Å.

8. A process according to claim 1, wherein the thickness of the silicon coating is between 3000 and 7000 Å and is preferably close to 5000 Å.

9. A process according to claim 1, wherein the silicon deposition operation takes place at a temperature between 350° and 650° C. and preferably at close to 500° C.

10. A process according to claim 1, wherein the silica coating deposition operation is followed by irradiation of the system with optical radiation in order to bring about a recrystallization of the silicon.

11. A process according to claim 2, wherein post-hydrogenation is performed in a hydrogen plasma at a temperature between 300° and 500° C. and preferably at close to 400° C.

* * * * *

UNITED STATES PATENT AND TRADEMARK OFFICE
CERTIFICATE OF CORRECTION

PATENT NO. : 4,426,407
DATED : January 17, 1984
INVENTOR(S) : Francois Morin, Jean-Luc Favennec, Madeleine Bonnel It is certified that error appears in the above-identified patent and that said Letters Patent are hereby corrected as shown below:

Column 3, lines 9 and 10, "The various operations constituting the process of the invention are as follows:" should follow the sentence ending on line 8, as --tor according to the process of the invention, the various operations constituting the process of the invention are as follows:--.

Column 3, line 67, "FIGURE (i)" should read --Fig. i)--.

Column 4, line 8, "10." should read --10,--.

Signed and Sealed this

Thirty-first Day of July 1984

[SEAL]

Attest:

GERALD J. MOSSINGHOFF

*Attesting Officer*  *Commissioner of Patents and Trademarks*